United States Patent
Shebaita (10) Patent No.: US 8,504,956 B1
(45) Date of Patent: Aug. 6, 2013

(54) CALCULATION OF INTEGRATED CIRCUIT TIMING DELAY USING FREQUENCY DOMAIN

(75) Inventor: Ahmed Mamdouh Shebaita, Santa Clara, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/460,814

(22) Filed: Apr. 30, 2012

(51) Int. Cl.
*G06F 9/455* (2006.01)
*G06F 17/50* (2006.01)

(52) U.S. Cl.
USPC ........... 716/108; 716/106; 716/110; 716/111; 716/113; 703/19

(58) Field of Classification Search
USPC ............. 716/106–108, 110–113; 703/19
See application file for complete search history.

(56) References Cited

U.S. PATENT DOCUMENTS

| | | | |
|---|---|---|---|
| 6,347,393 B1* | 2/2002 | Alpert et al. | 716/114 |
| 6,769,100 B2* | 7/2004 | Acar et al. | 716/109 |
| 6,807,659 B2* | 10/2004 | Alpert et al. | 716/113 |
| 7,124,381 B2* | 10/2006 | Lee et al. | 716/115 |
| 7,293,248 B2* | 11/2007 | Chang et al. | 716/108 |
| 7,600,206 B2* | 10/2009 | Lai et al. | 716/113 |
| 2004/0064798 A1* | 4/2004 | Alpert et al. | 716/6 |
| 2004/0243955 A1* | 12/2004 | Alpert et al. | 716/6 |
| 2007/0143719 A1* | 6/2007 | Chopra et al. | 716/4 |
| 2008/0222579 A1* | 9/2008 | Agarwal et al. | 716/4 |
| 2011/0041108 A1* | 2/2011 | Abbaspour et al. | 716/108 |
| 2011/0099531 A1* | 4/2011 | Celik et al. | 716/134 |

OTHER PUBLICATIONS

"A Novel Moment-Based Methodology for Accurate and Efficient Static Timing Analysis", by Ahmed Shebaita, Dusan Petranovic, Yehea Ismail, IEEE @2008.*
"Synopsis" Lecture Slides, Robert Reese, EE8273, Mississippi State University, published by Nov. 1, 2000, http://www.ece.msstate.edu/~reese/EE8273/lectures/synopsys/synopsys.pdf.
"Including inductance in static timing analysis," Shebaita, A.; Petranovic, D.; Ismail, Y., IEEE/ACM International Conference on Computer-Aided Design, 2007. ICCAD 2007, pp. 686-691.
"A novel moment-based methodology for accurate and efficient static timing analysis," Shebaita, A.; Petranovic, D.; Ismail, Y., IEEE International Conference on Integrated Circuit Design and Technology Tutorial, 2008. ICICDT 2008 , pp. 293-296.
"An s-domain based framework for accurate and efficient static waveform analysis," Shebaita, A.; Petranovic, D.; Ismail, Y., International Design and Test Workshop (IDT), 2009, pp. 1-6.

* cited by examiner

*Primary Examiner* — Nha Nguyen
(74) *Attorney, Agent, or Firm* — Adams Intellex, PLC (57) ABSTRACT

Accurate circuit and system timing analysis is a critical tool for designing and analyzing complex modern semiconductor chips. While the accuracy and detail of dynamic electrical simulation may be desirable in theory, such analysis is not feasible due to extreme computational complexity and open-ended simulation times. Improved circuit modeling and timing analysis tools that can provide both accuracy and computational efficiency are required. Table look-up (TLU) and other techniques provide computationally efficient timing analysis but may be undertaken at the expense of simulation accuracy. Instead, the use of current waveform moments representing the frequency domain equivalents of signals can provide the required simulation accuracy and computational efficiency.

17 Claims, 5 Drawing Sheets

CALCULATION OF INTEGRATED CIRCUIT TIMING DELAY USING FREQUENCY DOMAIN

FIELD OF INVENTION

This application relates generally to semiconductor analysis and more particularly to the use of the frequency domain for timing analysis in integrated circuits.

BACKGROUND

Detailed and accurate timing delay analysis is a critical step in the successful design of modern complex integrated circuits. In order to determine whether a proposed circuit implementation will meet key design criteria including at-speed operation, timing delay analysis of the proposed circuitry must be performed as accurately and efficiently as possible at numerous stages of the design process. Results of the detailed analysis of circuit delay directly impact logic synthesis, circuit placement, routing of interconnect, and the like. Further, optimization that may be performed late in the design cycle has a direct impact on system performance. Although detailed transistor-level circuit simulation could in theory be performed, such analysis is not remotely practical primarily because rigorous analysis of the proposed circuit results in immense computational requirements, test overhead, cost, and the like. Techniques such as static timing analysis have been used that provide analysis time speed-up but with limited simulation accuracy because such tests are based on simplified delay models. Ever-increasing complexity and density of modern complex integrated circuits demand improvements in analysis time efficiency of the circuit timing analysis.

Timing delay analysis accuracy and computational efficiency are conflicting but critical design objectives. Computational inefficiencies arise due to increased circuit complexity, accuracy limitations of the delay calculations, overly simplified delay models, lack of specific test cases, simplified signal waveforms, underestimation of wiring complexities, overestimation of worst case delay, and so on. Delay models are typically based on the assumption of input signal independence. Integrated circuit operation however is strongly dependent on critical path analysis, corner analysis, input signal behavior, and the like. In addition, many of the common challenges of chip design can be traced to interface timing problems between different components of the system design. In order to support practical circuit design, various timing estimation techniques have been proposed that provide some simulation time improvements over detailed circuit analysis. Various timing considerations must be made including setup time, hold time, propagation delays, and the like. Timing variations can be due to many design factors, process corners, varying input data, previous operations of the circuit, temperature, voltage, process variations, and the like.

SUMMARY

Complex VLSI systems demand detailed timing analysis at numerous design points throughout the implementation process. Accurate and computationally efficient techniques are required that take into account, for example, input voltage delay and input voltage slew, because voltage delay and slew directly impact timing characteristics of the circuits being driven. A computer implemented method for integrated circuit timing delay is disclosed comprising: obtaining an input voltage waveform to a circuit wherein the input voltage waveform comprises an input slew and an input delay and wherein the circuit comprises a driver circuit with an output connected to a wiring circuit wherein the wiring circuit has one or more sinks; pre-processing a composite current source library, wherein the library includes a representation of the driver circuit to determine current waveform moments for the driver circuit; obtaining the current waveform moments for the driver circuit based on the input slew to the driver circuit and based on the wiring circuit which is connected to the output of the driver circuit; and convolving the current waveform moments for the driver circuit with a frequency domain impulse response function for the wiring circuit to produce a frequency domain function for a voltage waveform at each sink. The method may further comprise calculating a delay and slew to each sink of the circuit based on the frequency domain function for the voltage waveform at each sink. The delay may be based on the input delay. The calculating the delay and slew may be calculated using poles and residues for each sink. The poles and residues may be computed using a Newton-Raphson method. The pre-processing may include generation of a vector of current waveform moments based on input slews and effective capacitances. The current waveform moments for the driver circuit, which were obtained, may be based on an effective capacitance of the wiring circuit. The effective capacitance may be based on distributive capacitive load in the wiring circuit. The effective capacitance may be further based on the current waveform moments for the driver circuit. The method may further comprise iterating between the current waveform moments and the effective capacitance. The method may further comprise computing a voltage waveform at each sink. One of the sinks may be connected to a receiver circuit. The composite current source library may include a table for look up of circuit moments. The method may further comprise using a look-up table to perform one of a group comprising static timing analysis, statistical timing analysis, noise computation, and static noise analysis.

In embodiments, a computer program product embodied in a non-transitory computer readable medium for delay calculation may comprise: code for obtaining an input voltage waveform to a circuit wherein the input voltage waveform comprises an input slew and an input delay and wherein the circuit comprises a driver circuit with an output connected to a wiring circuit wherein the wiring circuit has one or more sinks; code for pre-processing a composite current source library, wherein the library includes a representation of the driver circuit, to determine current waveform moments for the driver circuit; code for obtaining the current waveform moments for the driver circuit based on the input slew to the driver circuit and based on the wiring circuit which is connected to the output of the driver circuit; and code for convolving the current waveform moments for the driver circuit with a frequency domain impulse response function for the wiring circuit to produce a frequency domain function for a voltage waveform at each sink. The computer program product may further comprise code for calculating a delay and slew to each sink of the circuit based on the frequency domain function for the voltage waveform at each sink. The pre-processing may include generation of a vector of current waveform moments based on input slews and effective capacitances. In some embodiments, a computer system for delay calculation may comprise: a memory for storing instructions; one or more processors connected to the memory wherein the one or more processors are configured to: obtain an input voltage waveform to a circuit wherein the input voltage waveform comprises an input slew and an input delay and wherein the circuit comprises a driver circuit with an output connected to a wiring circuit wherein the wiring circuit has one or more sinks; pre-process a composite current source library, wherein the library includes a representation of the driver circuit, to determine current waveform moments for the driver circuit; obtain the current waveform moments for the driver circuit based on the input slew to the driver circuit and based on the wiring circuit which is connected to the output of the driver circuit; and convolve the current waveform moments for the driver circuit with a frequency domain impulse response function for the wiring circuit to produce a frequency domain function for a voltage waveform at each sink. The one or more processors may be further configured to calculate a delay and slew to each sink of the circuit based on the frequency domain function for the voltage waveform at each sink. The pre-processing may include generation of a vector of current waveform moments based on input slews and effective capacitances.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

The present disclosure provides a description of various methods, systems, and apparatus associated with the calculation of integrated circuit timing using the frequency domain. Accurate circuit timing calculation is critical to successful integrated circuit implementation. Many of the simplified analysis techniques that were sufficient in the past are no longer capable of accurate representation of signals and circuit performance in complex modern integrated circuits. Further, detailed dynamic circuit simulation is not possible for large integrated circuits and systems because of prohibitive computational complexity and time. Accurate analysis is critical throughout the circuit and system design process. Frequency domain usage makes timing analysis highly accurate while allowing computational ease.

Various design decisions taken as part of a typical integrated circuit design process directly impact timing of the resulting integrated circuit. Further, the resulting integrated circuits in turn directly impact timing of the resulting system. Thus, computationally efficient methods for calculating timing delay are demanded in the implementation of modern complex integrated circuits. Other types of detailed or estimated timing delay calculations are possible, but these methods lack the computational efficiency required for thorough system design. Further, these latter methods can miss certain types of timing problems because of over simplification of circuit and system models, wiring interconnect, and the like.

Identifying timing conflicts and other wiring or layout problems early in the design process can eliminate unacceptable design candidates and therefore is critical. Thus, only design candidates that meet critical criteria should be considered further. Even low-level circuits may require careful selection and an inverter or buffer with insufficient drive capability or with a layout that does not fit into a given floor plan can be eliminated quickly. Similarly, larger structures such as ALUs or multipliers must also be chosen that meets requirements for a particular design.

Figure 1:
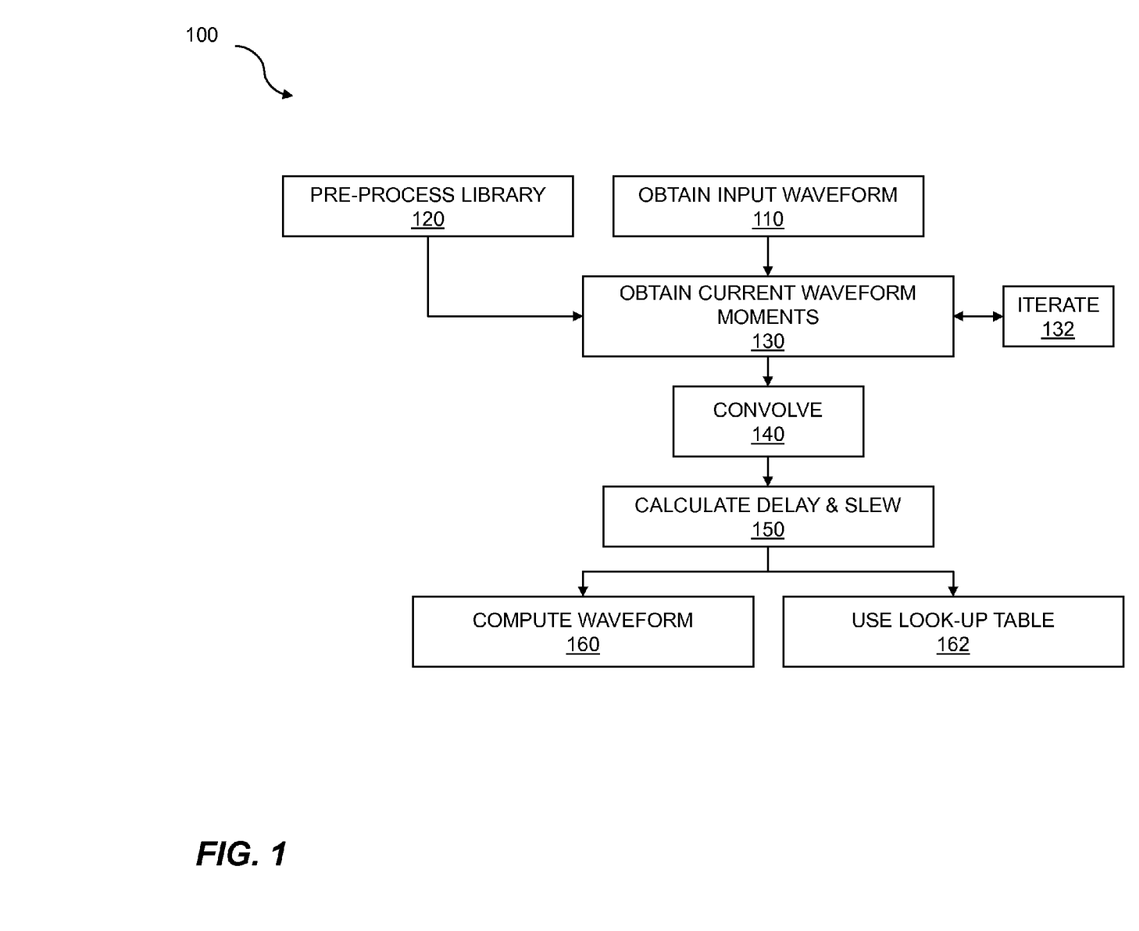
FIG. 1 is a flow diagram for performing timing analysis.

FIG. 1 is a flow diagram for performing timing analysis. A flow 100 is described for a computer-implemented method for delay calculation. Static Timing Analysis (STA) may be used for determining the delay along a path in an integrated circuit. A path may refer to a wire, a group of wires, a tree structure of wires and the like on an integrated circuit. Delay of a signal from a gate input to a gate output may be calculated based on the effects imposed by the gate, the slew and delay of the input signal, and the effects imposed by the interconnect. The STA techniques may be based on a look-up table, where the lookup table comprises input voltage slew rates, effective capacitances, output waveform values, and the like. These tables take an input slope (input slew rate) and an output capacitive load to generate a circuit delay and output voltage slope (output slew rate). Other methods exist for approximating gate delay such as the K-factor model. The K-factor model approximates the value of delay as a constant plus k times the load capacitance at the output of the gate. However, the K-factor model is not accurate in various cases. Further, more complex techniques exist such as those that base models on a Delay Calculation Language or DCL are possible where a user-defined program is called to perform delay calculations whenever a delay value is required. This latter technique allows the use of arbitrarily complex models to represent circuits at the expense of output delay calculation times and significant software engineering issues.

The flow 100 may begin with obtaining an input voltage waveform 110 to a circuit wherein the input voltage waveform comprises an input slew and an input delay (the timing at which the input transitions), and wherein the circuit comprises a driver circuit with an output connected to a wiring circuit wherein the wiring circuit has one or more sinks. The input voltage waveform may be a digitized version of an actual waveform, an approximation of a waveform, an arbitrary waveform, or any of a variety of other waveforms or their approximations. The driver circuit may be based on a typical output gate, a model gate output, a generic gate output, and the like. The particular output or outputs of interest are those of a gate being analyzed for timing delay. The driver circuit takes the input signal to a gate and transfers it to the circuit representing the output wiring. The output voltage and slew values of the driver may be determined from the table entries based on the input voltage slew rate and the output capacitive load data stored in the STA table.

The wiring connected to the driver at the output of a logic gate presents a load on the gate. Various techniques may be used to approximate the load on the gate. The simplest, fastest and least accurate model, called Lumped C, estimates the total capacitance on an output of a given gate and adds it to the output of the gate. Signal delay due to resistance and capacitance that would normally be obtained from the wire itself is ignored. Although this lumped C model is computationally fast, the model results are rarely sufficiently accurate for modern, complex integrated circuit timing analysis. Another technique which more accurately yet efficiently calculates signal delay is referred to as Elmore delay. Here, the delay due to resistance and capacitance of each leg (arc) of the output wire tree connected to the output of the driver is determined with RC values (Resistance×Capacitance). Next, RC products are added together starting at the output or root of the gate or driver. This simplified approach takes into account some of the resistance and capacitance effects on output delay of wiring and provides modest accuracy for typical modern integrated circuits. A more modern and sophisticated analysis technique is referred to as Moment Matching. Moment matching can be thought of as either matching multiple moments in the time domain, or finding a reasonable, rational approximation in the frequency domain. Further, moment matching can be thought of as a generalization of Elmore delay, where the latter matches the first moment in the time domain or computes a one-pole approximation in the frequency domain. The moment matching-based methods are slower than the Elmore method but are more accurate. In comparison to dynamic circuit simulation (i.e. SPICE) the moment-based techniques are faster but less accurate.

The flow 100 may include pre-processing a composite current source library 120, wherein the library includes a representation of the driver circuit, to determine current waveform moments for the driver circuit. Either voltages or currents may represent signals at the input of a given gate. Analysis begins by representing the effect of the input signal on circuit delay by populating a table. Various types of waveforms have been used to represent the complex signals in complex modern integrated circuits. The input voltage waveform may take various forms as complex input signals are used to improve accuracy of the timing analysis process. Historically only a few points (times and voltages or currents) have been included to describe a waveform. Greater accuracy would require an explosion of points with the added calculating complexity and associated run time. By analyzing with moments, calculation complexity is greatly simplified and higher accuracy is possible through the addition of one or more moments. A small number of moments suffice for high accuracy waveform description and analysis. Additionally, moments enable frequency calculations otherwise very problematic. For instance, inductance effects with the associated RLC calculations would prove difficult in time domain are simple in frequency domain implementations. Further, high frequency impacts, such as skin effect and transmission line usage can be calculated with the same ease as other frequency domain calculations.

Detailed information about the input waveform may be obtained through the use of a dynamic circuit simulator such as SPICE™. Parameters (here moments) are calculated a priori and are stored in a table. It should be noted that the moments which are stored in the table are calculated earlier and do not impact run time during timing calculations. It should also be noted that higher accuracy may be utilized by including more moments and these moments again are calculated earlier during pre-processing and do not impact run time during the timing calculations. Moments may be based on a piecewise linear (PWL) representation of the input waveform. Effective capacitance at the output of the gate is also incorporated into the table. In the context of semi-custom digital design, pre-characterized digital information is often abstracted in the form of a two-dimensional (2-D) look up table (LUT). The 2D table represents information about the variability of the gate's delay with respect to the two independent variables, usually the rate of change of the signal at the input (slew) and the load at the output of the gate (capacitance). To create a current-referenced version of the input signal, a current source is based on a DC current source that is dependent on the input signal and the effective capacitance at the gate output. More complex models may be considered which are based on input switching effects and non-linear effective capacitance, for example.

The flow 100 may continue with obtaining the current waveform moments 130 for the driver circuit based on the input slew to the driver circuit and based on the wiring circuit which is connected to the output of the driver circuit. The obtaining of the current waveform moments may be accomplished from the composite current source library based on values that describe the input slew, the driver circuit, and the wiring circuit. Various closed form expressions exist for computing the moments of the input waveforms. The current waveform moments ($m_0, m_1, m_2, m_3, \ldots$) at the output of the driver circuit describe an equation (1) in the frequency domain. In this equation F(s) may represent a transfer function and s represent a frequency variable which may alternatively be shown as $\sigma+j\omega$ where $\sigma$ is an attenuation factor, j is $\sqrt{-1}$, and $\omega$ is the frequency. In embodiments, $m_0$ would be 1 for rising waveforms and would be 0 for falling waveforms.

$$F(s)=m_0+m_1 s+m_2 s^2+m_3 s^3+\ldots \quad (1)$$

Often, only a few moments are needed to achieve simulation accuracy while having the benefit of computational efficiency. Also, the use of moments increases visibility of a gate output. Calculation of the current waveform moments that will be input into the driver circuit are based on the slew of the input signal, the driver circuit, and the output wiring circuit connected to the driver. Calculating the first few moments of current at an output of a gate is based on the response of the actual gate. Moment information may be obtained through the use of a circuit simulator such as SPICE. In some embodiments, the flow 100 may include iterating between the current waveform moments and the effective capacitance 132 to achieve a higher accuracy result. The effective capacitance is a value for the capacitive load seen at the output of the driver circuit. This effective capacitance value is a function of the slew rate for the signal at the output of the driver circuit. For example, if the slew rate is slow then most of the capacitive load along the output wiring circuit will be included in the effective capacitance. Alternatively, if the slew rate is fast then only the capacitive load in the wiring circuit near the driver circuit will be included in the effective capacitance. Thus iterating 132 may be used to determine moments and capacitive load. Two to three iterations will suffice in most embodiments.

The flow 100 may continue with convolving 140 the current waveform moments for the driver circuit with a frequency domain impulse response function for the wiring circuit to produce a frequency domain function for a voltage waveform at each sink. To obtain the signal waveforms at the one or more sinks connected to the output of the driver circuit, simple convolution may be performed. Convolution of the gate output signal with the interconnect moments may yield the output waveform signal moments of the stage output with the added benefit of computational efficiency. In embodiments, the convolution is simply the multiplication of one transfer function with another transfer function such as the multiplication of a transfer function for a driver circuit with a transfer function for a wiring circuit.

The flow 100 may continue with calculating of a delay and slew 150 to each sink of the circuit based on the frequency domain function for the voltage waveform at each sink. The determining of the delay and slew may include using poles and residues for each sink. The poles and residues may be computed using a Newton-Raphson method or other computationally efficient method. The parameters of interest for the gate input waveform models can be calculated using closed form expressions based on the first few moments.

The flow 100 may continue with computing a voltage waveform 160 at each sink. The voltage waveforms can be derived from the moments. The flow 100 may include using a look-up table 162 to perform one of a group comprising static timing analysis, statistical timing analysis, noise computation, and static noise analysis. The resulting moment values calculated above can be used for each of these types of analysis. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
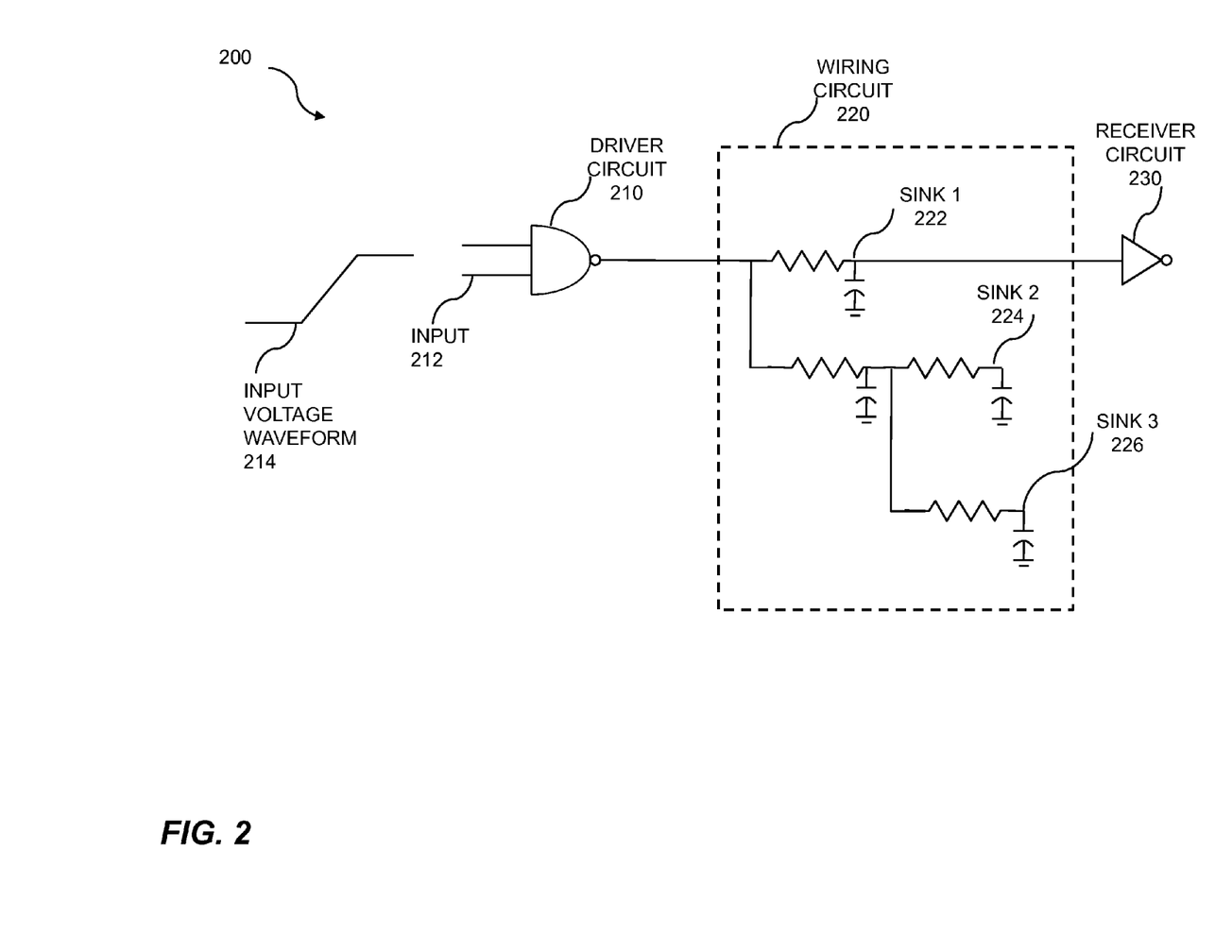
FIG. 2 is a circuit diagram with a driver circuit and sinks.

FIG. 2 is a circuit diagram with driver circuit and sinks. A circuit 200 is shown which may comprise a driver circuit 210, a wiring circuit 220, and a receiver circuit 230. An input voltage waveform 214 is injected into circuit input 212 of driver circuit 210. The input voltage waveform 214 may be a voltage from an input pin to a chip, a signal from another circuit on a chip, and the like. An example waveform 214 is shown, but other waveforms may in fact be present at input 212. The example waveform shows a low voltage, a transition phase, and a high voltage. Other more complex voltage waveforms may exist wherein the various voltage values are non-linear.

A wiring circuit 220 is shown which introduces circuit elements to model signal delay through a gate with the overall delay being based on the input delay. The wiring circuit 220 shows three sinks: Sink 1 222, Sink 2 224, and Sink 3 226. Any number of sinks may be present in the wiring circuit 220. The sinks may correspond to integrated circuit wiring connected to driver circuit 210. Sink 1 may be at the end of wiring corresponding to a signal 1, Sink 2 to wiring corresponding to a signal 2, and the like. The resistor R and capacitor C connected ahead of Sink 1 may be related to resistance and capacitance of a wire, a network of wires, and the like. Any number of resistance and capacitance stages may be included ahead of a sink. The number of stages chosen depends on simulation speed, modeling accuracy, and the like. The resistances and capacitances may be used to determine delay through a circuit.

One of the sinks 222 is connected to a receiver circuit 230. Here, only one receiver 230 is shown connected to Sink 1 but numerous others may exist. In other embodiments, receiver circuits may be connected to Sink 2 224, Sink 3 226, and the like. Further, circuit configurations could be imagined in which more than one receiver circuit is connected to a sink.

Figure 3:
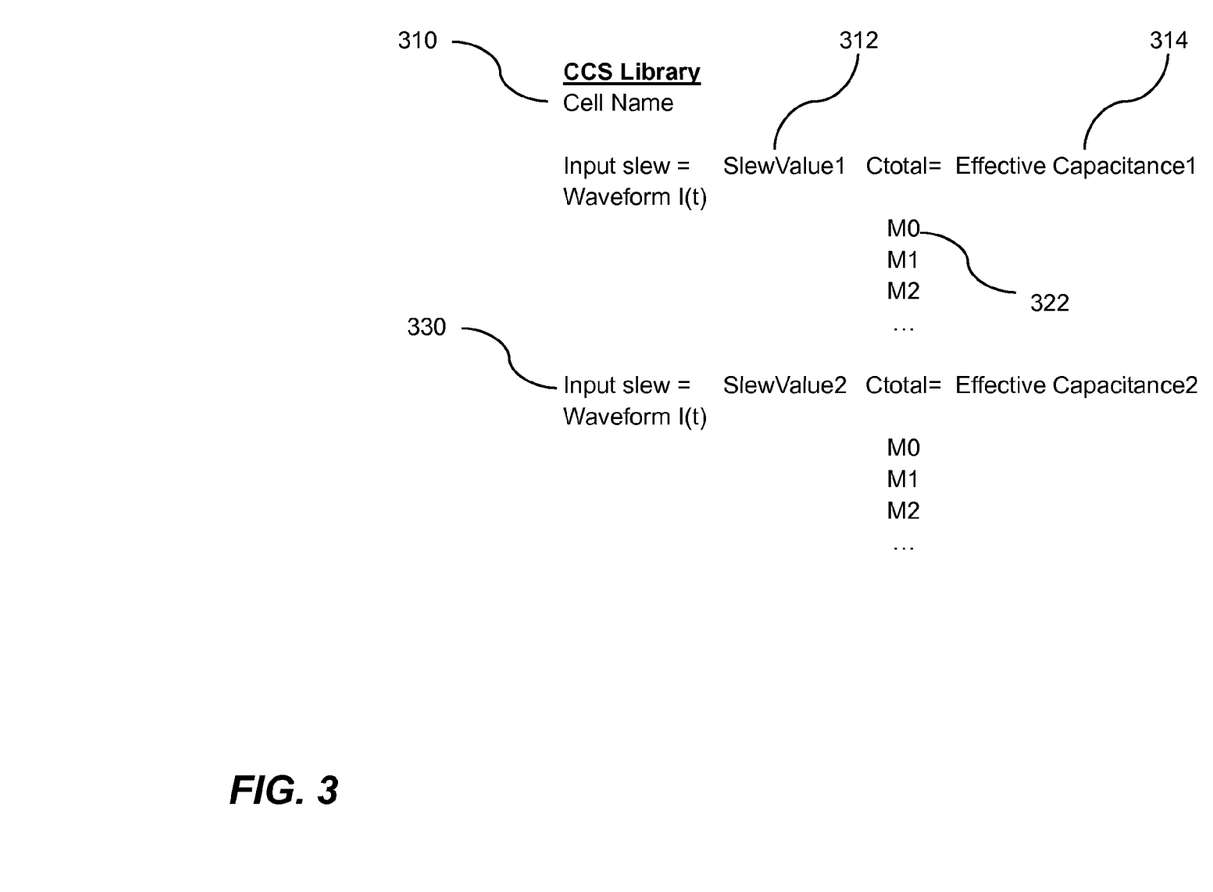
FIG. 3 is an example of composite current source table information.

FIG. 3 is an example of composite current source table information. The composite current source library includes a table for look up of circuit moments. The figure represents an example entry within a composite current source library. An entry in the composite current source library begins with a Cell Name 310. The cell name describes a particular circuit cell that may be used in a larger, more complex integrated circuit. The composite current source library entry continues with one or more entries for an input slew 312, an effective capacitance 314, and current waveform moment values 322. For a given cell name 310, one or more input slew rates may be included. Any number current waveform moment entries may be included for input slew Waveform I(t). The composite current source table for the given example Cell Name 310 may continue with further input slew, effective capacitance, and current waveform moment values 330. In embodiments, any number of input slew, effective capacitance, and current waveform moment entries may be included for a given cell name. More moments would correspond to greater accuracy. In many embodiments, three moments suffice for needed accuracy.

Any number of cell names may be included in a composite current source (CCS) library. The cell names may refer to simple cells, different versions of simple cells, and the like. Different versions of cells may refer to cells with different numbers of inputs, outputs with different drive capabilities, and the like. Similarly, the cell names included in a composite current source library may refer to complex cells that may be based on one or more simple cells. Further, different versions of cells may refer to cells with different numbers of inputs, outputs with different drive capabilities, and the like. Any number of input slew values, total capacitance values, and current waveform moments may be included, in embodiments. In other embodiments, a composite current source library may include times and currents corresponding to those times. These times and currents may be used to define a current waveform. These times and currents may be pre-processed to generate the current waveform moments.

Figure 4:
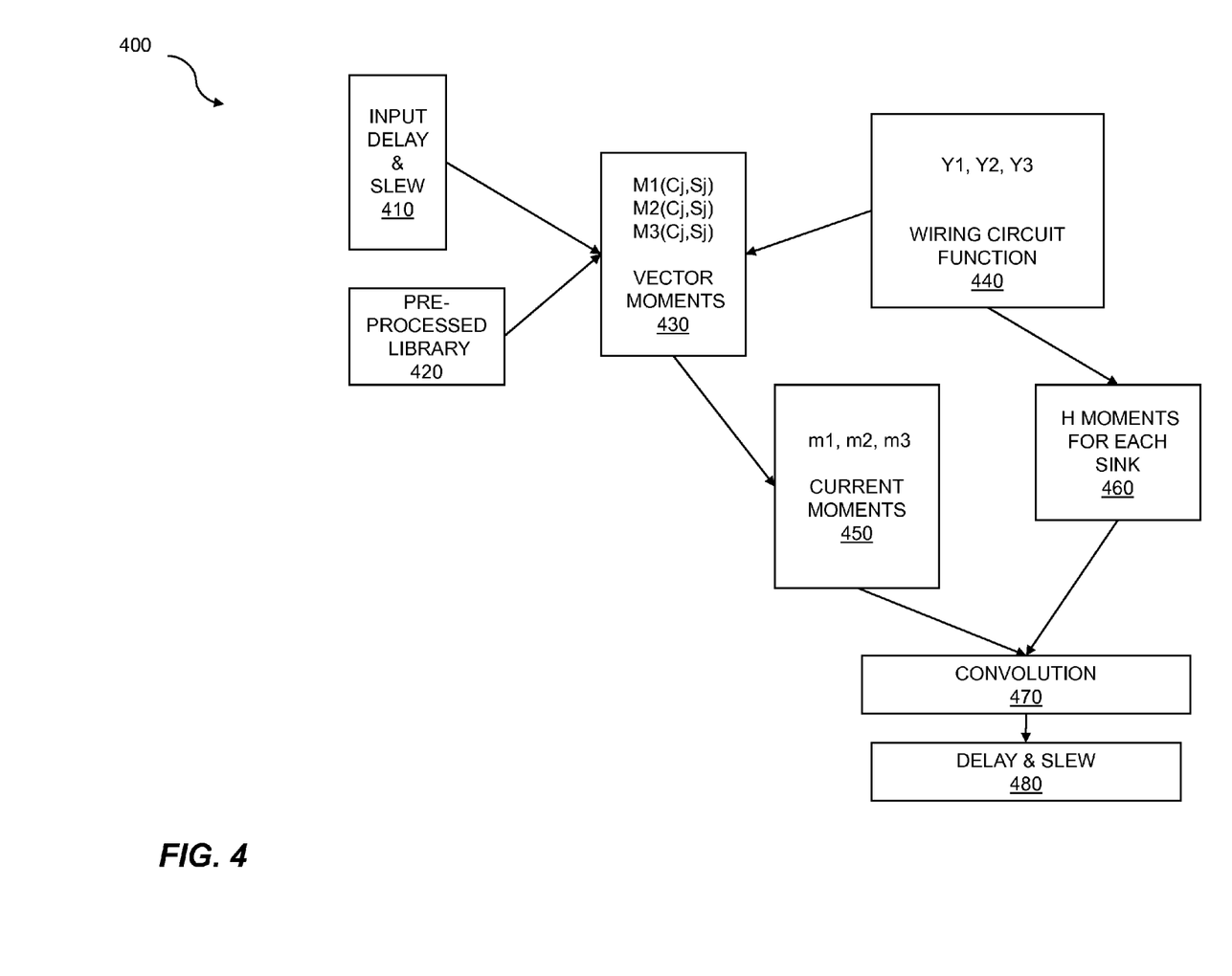
FIG. 4 is a diagram showing timing value generation.

FIG. 4 is a diagram showing timing value generation 400. The flow 400 may begin with input delay and slew value determination 410. These input and slew values may represent an input signal, for example. The flow 400 may include pre-processing a library 420 where the pre-processing generates the values included in a vector of current waveform moments based on various input slews and effective capacitances. Based on the input delay and slew values 410, vector moments 430 may be determined by looking up moments from the pre-processed library. In 430, three moments M1(Cj, Sj), M2(Cj,Sj) and M3(Cj,Sj) for a vector are shown. In some embodiments, Cj may represent an effective capacitance and Sj may represent a slew rate. In embodiments, any number of moments Mn(Cj,Sj) may be present in a vector. One or more vector moments may be extracted from the pre-processed library 420.

The flow 400 may include determining moments for the wiring circuit function 440. In 440, three vector moments related to wiring circuit function Y1, Y2, and Y3 are shown. In embodiments, any number of vector moments YN may be extracted based on a wiring circuit function.

The flow 400 may continue with determining the current waveform moments 450 for the driver circuit. In some embodiments, these current waveform moments may be based on an effective capacitance of the wiring circuit. The effective capacitance may be based on distributive capacitive load in the wiring circuit. The effective capacitance may further be based on the current waveform moments for the driver circuit. In some embodiments, the flow 400 may include iterating between the current waveform moments and the effective capacitance until an acceptable solution is identified. The three moments 450 may be based on effective capacitance. In embodiments, any number of moments m may be extracted based on the effective capacitance, desired simulation accuracy, and the like.

The flow 400 may continue with determining H moments for each sink 460. In embodiments, any number of H moments may be determined. The H moments may be determined by table lookup and can be understood further from equation 2. In equation 2, H1(s) may represent the transfer function for a sink while $m_1$, $m_2$, through $m_n$ represent the moments for the sink and the ck1 superscript denotes that the moments are for circuit named ck1. In this example the ck1 may refer to the wiring to sink 1.

$$H_1(s)=1+m_1^{ck1}s+m_2^{ck1}s^2+\ldots \quad (2)$$

The flow 400 may continue with convolution of the various moments m, Y, and H 470 to determine the moments at the output of the driver circuit. Based on the convolution results, the delay and slew of the output voltage at the output of the driver circuit may be determined 480. Various steps in the flow 400 may be changed in order, repeated, omitted, or the like without departing from the disclosed inventive concepts. Various embodiments of the flow 400 may be included in a computer program product embodied in a non-transitory computer readable medium that includes code executable by one or more processors.

Figure 5:
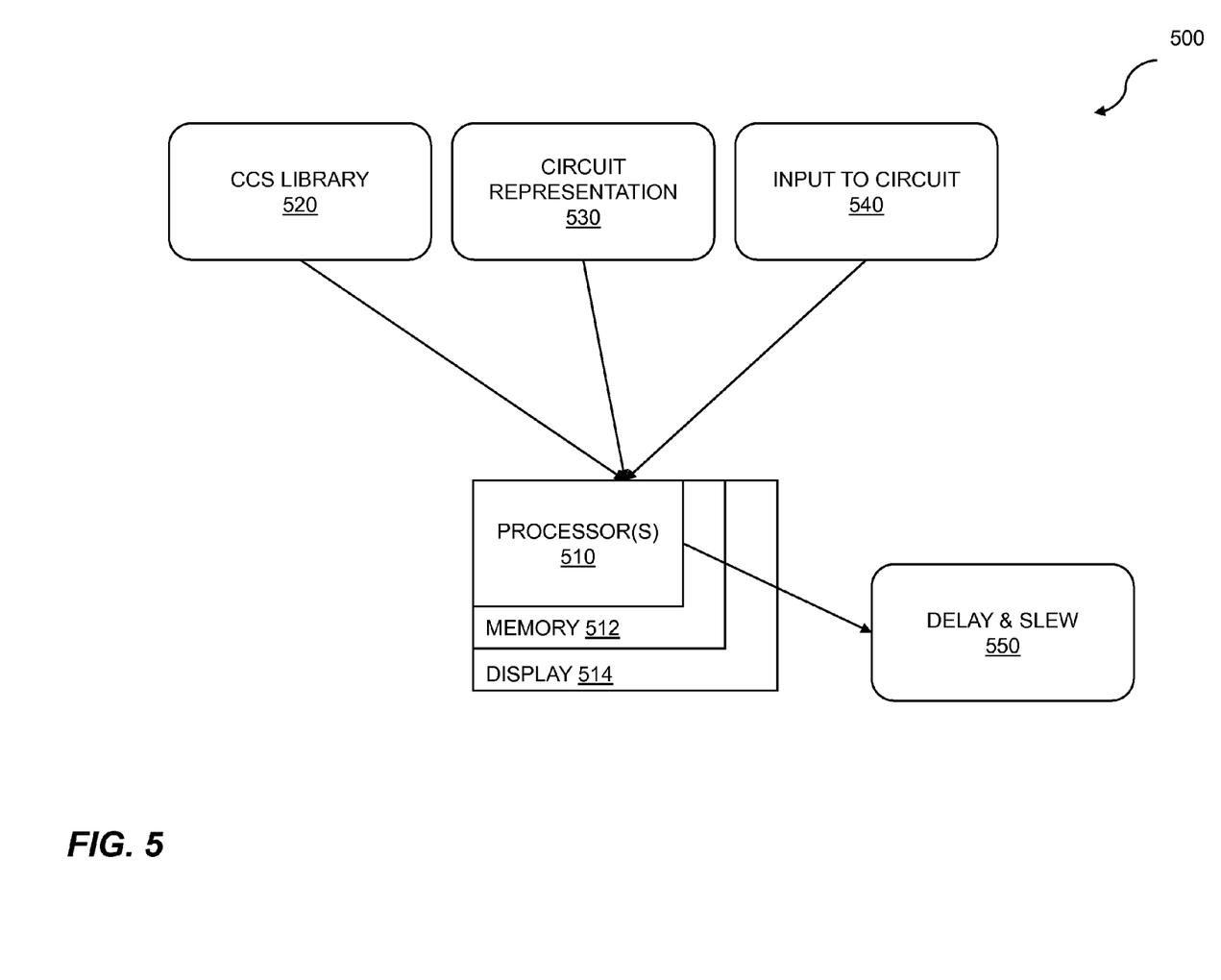
FIG. 5 is a system diagram for timing analysis.

FIG. 5 is a system diagram for timing analysis 500. A system 500 has a memory 512 for storing instructions, data, and the like, attached to one or more processors 510. The one or more processors 510 may be located in any one or more of a range of devices including a laptop, tablet, handheld, server, desktop machine or the like, or may be linked together over a network such as the Internet. The memory 512 may contain instructions that may be executed by the one or more processors 510. The memory 512 may contain circuit information in various forms, help information, and the like. The one or more processors 510 attached to the memory 512 may execute instructions to determine delay calculations. The instructions stored in memory 512 may include code for obtaining an input voltage waveform to a circuit, code for pre-processing a composite current source library, code for determining the current waveform moments for the driver circuit based on the input slew and the wiring circuit which is connected to the output of the driver circuit, code for convolving the current waveform moments for the driver circuit with a frequency domain impulse response function, and the like. The system 500 may include a display 514 for showing data, instructions, help information, simulation results, and the like. The display may be used for showing input to a circuit 540, composite current source library entries 520, circuit representations 530, and the like. The display may be any one or more of a range of displays that may include a laptop, a tablet, an LCD, a projector, and the like.

The computer system 500 may pre-process a composite current source library (CCS) 520, which includes a representation of the driver circuit, to determine current waveform moments for the driver circuit. The system 500 may load a circuit representation 530 of the circuit being analyzed. The one or more processors 510, attached to the memory 512, may be configured to obtain an input voltage waveform to a circuit 540. The input voltage waveform may include an input slew and an input delay, and the circuit may include a driver circuit with an output connected to a wiring circuit, where the wiring circuit has one or more sinks. The computer system for delay calculation 500 may convolve the current waveform moments for the driver circuit with a frequency domain impulse response function for the wiring circuit to produce a frequency domain function for a voltage waveform at each sink that may include delay and skew 550

The system 500 may include a memory for storing instructions and one or more processors connected to the memory wherein the one or more processors are configured to: obtain an input voltage waveform to a circuit wherein the input voltage waveform comprises an input slew and an input delay and wherein the circuit comprises a driver circuit with an output connected to a wiring circuit wherein the wiring circuit has one or more sinks; pre-process a composite current source library, wherein the library includes a representation of the driver circuit, to determine current waveform moments for the driver circuit; determine the current waveform moments for the driver circuit based on the input slew to the driver circuit and based on the wiring circuit which is connected to the output of the driver circuit; and convolve the current waveform moments for the driver circuit with a frequency domain impulse response function for the wiring circuit to produce a frequency domain function for a voltage waveform at each sink.

Each of the above methods may be executed on one or more processors on one or more computer systems. Embodiments may include various forms of distributed computing, client/server computing, and cloud based computing. Further, it will be understood that for each flow chart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which may be generally referred to herein as a "circuit," "module," or "system."

A programmable apparatus that executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A computer implemented method for delay calculation comprising:
   obtaining, using one or more processors, an input voltage waveform to a circuit wherein the input voltage waveform comprises an input slew and wherein the circuit comprises a driver circuit with an output connected to a wiring circuit wherein the wiring circuit has one or more sinks;
   pre-processing a composite current source library, wherein the library includes a representation of the driver circuit;
   determining current waveform moments for the driver circuit based on the pre-processing, the input slew to the driver circuit, and the wiring circuit which is connected to the output of the driver circuit;
   convolving the current waveform moments for the driver circuit with a frequency domain impulse response function for the wiring circuit to produce a frequency domain function for a voltage waveform at each sink; and
   calculating a delay and slew to each sink of the circuit based on the frequency domain function for the voltage waveform at each sink, where the input voltage waveform further comprises an input delay.

2. The method of claim 1 wherein the delay is based on the input delay.

3. The method of claim 1 wherein the calculating the delay and slew is calculated using poles and residues for each sink.

4. The method of claim 3 wherein the poles and residues are computed using a Newton-Raphson method.

5. The method of claim 1 wherein the pre-processing includes generation of a vector of current waveform moments based on input slews and effective capacitances.

6. The method of claim 1 wherein the current waveform moments for the driver circuit, which were obtained, are based on an effective capacitance of the wiring circuit.

7. The method of claim 6 wherein the effective capacitance is based on distributive capacitive load in the wiring circuit.

8. The method of claim 7 wherein the effective capacitance is further based on the current waveform moments for the driver circuit.

9. The method of claim 8 further comprising iterating between the current waveform moments and the effective capacitance.

10. The method of claim 1 further comprising computing a voltage waveform at each sink.

11. The method of claim 1 wherein one of the sinks is connected to a receiver circuit.

12. The method of claim 1 wherein the composite current source library includes a table for look up of circuit moments.

13. The method of claim 1 further comprising using a look-up table to perform one of a group comprising static timing analysis, statistical timing analysis, noise computation, and static noise analysis.

14. A computer program product embodied in a non-transitory computer readable medium for delay calculation, the computer program product comprising:
   code for obtaining an input voltage waveform to a circuit wherein the input voltage waveform comprises an input slew and wherein the circuit comprises a driver circuit with an output connected to a wiring circuit wherein the wiring circuit has one or more sinks;
   code for pre-processing a composite current source library, wherein the library includes a representation of the driver circuit;
   code for, determining current waveform moments for the driver circuit based on the pre-processing, the input slew to the driver circuit, and based on the wiring circuit which is connected to the output of the driver circuit;
   code for convolving the current waveform moments for the driver circuit with a frequency domain impulse response function for the wiring circuit to produce a frequency domain function for a voltage waveform at each sink; and code for calculating a delay and slew to each sink of the circuit based on the frequency domain function for the voltage waveform at each sink, where the input voltage waveform further comprises an input delay.

15. The computer program product of claim 14 wherein the pre-processing includes generation of a vector of current waveform moments based on input slews and effective capacitances.

16. A computer system for delay calculation comprising:
a memory for storing instructions;
one or more processors connected to the memory wherein the one or more processors are configured to:
obtain an input voltage waveform to a circuit wherein the input voltage waveform comprises an input slew and wherein the circuit comprises a driver circuit with an output connected to a wiring circuit wherein the wiring circuit has one or more sinks;
pre-process a composite current source library, wherein the library includes a representation of the driver circuit;
determine current waveform moments for the driver circuit based on the pre-processing, the input slew to the driver circuit, and the wiring circuit which is connected to the output of the driver circuit;
convolve the current waveform moments for the driver circuit with a frequency domain impulse response function for the wiring circuit to produce a frequency domain function for a voltage waveform at each sink; and
calculate a delay and slew to each sink of the circuit based on the frequency domain function for the voltage waveform at each sink, where the input voltage waveform further comprises an input delay.

17. The system of claim 16 wherein pre-processing includes generation of a vector of current waveform moments based on input slews and effective capacitances.

* * * * *